US008091056B1

(12) United States Patent  
Campbell et al.

(10) Patent No.: US 8,091,056 B1  
(45) Date of Patent: Jan. 3, 2012

(54) APPARATUS AND METHOD FOR AUTOMATED DETERMINATION OF TIMING CONSTRAINTS

(75) Inventors: Scott J. Campbell, Frederick, CO (US); Mona D. Rideout, Fort Collins, CO (US); Paul J. Glairon, Longmont, CO (US)

(73) Assignee: Xilinx, Inc., San Jose, CA (US)

(*) Notice: Subject to any disclaimer, the term of this patent is extended or adjusted under 35 U.S.C. 154(b) by 266 days.

(21) Appl. No.: 12/474,964

(22) Filed: May 29, 2009

(51) Int. Cl.  
*G06F 17/50* (2006.01)

(52) U.S. Cl. ......... 716/113; 716/106; 716/108; 716/102

(58) Field of Classification Search .................. None  
See application file for complete search history.

(56) References Cited

U.S. PATENT DOCUMENTS

| | | | | |
|---|---|---|---|---|
| 6,181,320 B1* | 1/2001 | Fredrickson | ................ | 345/440 |
| 6,477,683 B1* | 11/2002 | Killian et al. | ................ | 716/106 |
| 6,530,073 B2* | 3/2003 | Morgan | ................ | 716/102 |
| 6,760,888 B2* | 7/2004 | Killian et al. | ................ | 716/102 |
| 7,412,673 B1* | 8/2008 | Duong | ................ | 716/115 |
| 7,421,675 B1* | 9/2008 | Campbell et al. | ................ | 716/113 |
| 2003/0237067 A1* | 12/2003 | Mielke et al. | ................ | 716/6 |
| 2006/0136853 A1* | 6/2006 | Advani | ................ | 716/6 |
| 2006/0282808 A1* | 12/2006 | Byrn et al. | ................ | 716/6 |
| 2007/0089076 A1* | 4/2007 | Amatangelo | ................ | 716/6 |
| 2007/0234266 A1* | 10/2007 | Chen et al. | ................ | 716/13 |
| 2010/0070935 A1* | 3/2010 | Bist et al. | ................ | 716/4 |

OTHER PUBLICATIONS

Xilinx, System Generator for DSP, User Guide, Release 10.1, pp. 1-30, Mar. 2008.*  
Jerry A. Long, Digital Timing: Using TimingDesigner with the Altera FPGA Design Flow, pp. 1-17, Oct. 2008.*  
EMA Desgin AUtomation, Static Timing Analysis Tool, pp. 1-2, 2007.*  
Jerry A. Long, Using a Static Timing Analysis Tool to Generate SDC Timing Constraints, pp. 1-7, Oct. 2008.*  
Richard Goering, Programmable Logic—Timing Analyzer pouts ASIC-like functionality in FPGAs, p. 38, Electroniic Engineering Times, 2005, 1379.*

* cited by examiner

*Primary Examiner* — Leigh Garbowski  
*Assistant Examiner* — A. M. Thompson  
(74) *Attorney, Agent, or Firm* — Michael T. Wallace; LeRoy D. Maunu; Thomas George

(57) ABSTRACT

A method and apparatus is provided for the automatic creation of timing constraints that are based upon input interface timing parameters entered through a graphical user interface that is associated with the one or more input interfaces. Ideal timing constraints are created from the input interface timing parameters for the one or more input interfaces, thereby enabling the analysis of the input interface(s) without requiring explicit constraints to be defined by the designer of the input interface(s). Timing constraints may, therefore, be automatically generated by the designer without the need for the designer to possess any detailed knowledge of the associated constraint language parameters. Once created, the automatically generated timing constraints are graphically displayed to the designer for verification and/or modification. The automated process removes any potential for improperly defining the input constraint language parameters associated with the input interface(s).

18 Claims, 6 Drawing Sheets

US 8,091,056 B1

APPARATUS AND METHOD FOR AUTOMATED DETERMINATION OF TIMING CONSTRAINTS

FIELD OF THE INVENTION

The present invention generally relates to input/output (I/O) interfaces, and more particularly to the automated determination of timing constraints associated with the I/O interfaces.

BACKGROUND OF THE INVENTION

PLDs are a well-known type of integrated circuit that may be programmed to perform specified logic functions. One type of PLD, the Field Programmable Gate Array (FPGA), typically includes an array of programmable tiles. These programmable tiles can include, for example, Input/Output Blocks (IOBs), Configurable Logic Blocks (CLBs), dedicated Random Access Memory Blocks (BRAM), multipliers, Digital Signal Processing blocks (DSPs), processors, clock managers, Delay Lock Loops (DLLs), Multi-Gigabit Transceivers (MGTs) and so forth.

Each programmable tile typically includes both programmable interconnect and programmable logic. The programmable interconnect typically includes a large number of interconnect lines of varying lengths interconnected by Programmable Interconnect Points (PIPs). The programmable logic implements the logic of a user design using programmable elements that may include, for example, function generators, registers, arithmetic logic, and so forth.

The programmable interconnect and the programmable logic are typically programmed by loading a stream of configuration data into internal configuration memory cells during a configuration event that defines how the programmable elements are configured. The configuration data may be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these PLDs, the functionality of the device is controlled by configuration data bits provided to the device for that purpose. The configuration data bits can be stored in volatile memory (e.g., static memory cells, as in FPGAs and some CPLDs), in non-volatile memory (e.g., FLASH memory, as in some CPLDs), or in any other type of memory cell.

Prior to configuring the PLD for operation, a PLD analysis tool may be utilized to analyze the PLD design, whereby implementation constraints may be imposed by the PLD analysis tool to verify the validity of the PLD design. The constraints may be stored within a user constraints file (UCF), or conversely may be specified within the hardware design language (HDL) or synthesis constraints file.

Input interfaces of the PLD design, however, present one of the most problematic and confusing areas for applying timing constraints, due in large part to the proliferation of I/O interface communication standards and their associated specifications. Application of the timing constraints to the input interfaces of the PLDs is especially necessary due to the fact that PLDs are ideally suited for the implementation of a plurality of I/O interfaces that are capable of supporting a large number of I/O interface standards. For example, many PLD based processing systems operate according to the peripheral component interconnect (PCI) standard, which among other features, defines a specification for attaching peripheral devices to a computer mother board. In other examples, PLD based processing systems may also utilize the high speed transceiver logic (HSTL) standard for data transfers to and from memory, and/or the low-voltage differential signaling (LVDS) standard for backplane communications. Other I/O interface definitions continue to emerge as I/O interface standards continue to be developed.

As a result, the PLD designer is plagued with the responsibility of assigning constraints to the various I/O interfaces that support the growing number of I/O interface standards during analysis. In addition, the PLD designer must also account for the specific data rate and data alignment variations that are coupled with the large variety of constraint language options available in order to properly constrain the input interfaces. Still further, the PLD designer is required to have a detailed understanding of the particular constraint language being utilized, so as to create the most efficient and comprehensive set of constraints possible.

Efforts continue, therefore, to simplify the application of input timing constraints to the I/O interfaces of the PLD.

SUMMARY OF THE INVENTION

To overcome limitations in the prior art, and to overcome other limitations that will become apparent upon reading and understanding the present specification, various embodiments of the present invention disclose a method and apparatus for the automatic creation of timing constraints based upon a graphical representation of input interface timing parameters that are associated with one or more input interfaces. In addition, ideal timing constraints are created for the input interface, thereby enabling the analysis of the input interface without requiring explicit constraints to be defined by the circuit designer.

In accordance with one embodiment of the invention, a method of automatically generating timing constraints for an input interface comprises retrieving timing parameters associated with the input interface, determining an amount of time relative to a logic transition of a clock signal that a data signal first becomes available for capture, determining an amount of time relative to the logic transition of the clock signal that the data signal remains valid, generating timing constraints relative to the input interface in response to the determinations and timing parameters, and graphically illustrating the generated timing constraints.

In this embodiment, the retrieving timing parameters associated with the input interface can comprise retrieving timing parameters from a graphical user interface. The timing parameters can comprise: a description of an input interface type; a data rate type associated with the data signal; and a description of a transition type of the clock signal that is used by the input interface to capture the data signal. Determining an amount of time relative to a transition of a clock signal that a data signal first becomes available for capture can comprise determining an ideal rising offset value in response to the retrieved timing parameters. Determining an amount of time relative to the transition of the clock signal that the data signal remains valid can comprise determining an ideal falling offset value in response to the retrieved timing parameters. Generating timing constraints relative to the input interface in response to the determinations and timing parameters can comprise generating timing constraint code segments in a language that is native to a development station that hosts the graphical user interface.

In this embodiment, graphically illustrating the generated timing constraints can comprise: graphically displaying a clock detail selection area that provides details associated with the clock signal; and modifying the details associated with the clock signal from within the clock detail selection area. Graphically illustrating the generated timing constraints can further comprise: graphically displaying a rising and falling edge parameter area that provides details associated with the data signal relative to the clock signal; and modifying the relative details associated with the data and clock signals from within the rising and falling edge parameter area. Graphically illustrating the generated timing constraints can further comprise graphically displaying an input pad group that provides details associated with a group of signal pads configured to receive the data signal. Graphically illustrating the generated timing constraints can further comprise graphically displaying a timing diagram that reflects timing relationships between the data and clock signals as defined within the clock detail selection area and the rising and falling edge parameter area.

In accordance with another embodiment of the invention, a development station comprises a processor and a constraint generation block that is coupled to the processor. The processor is adapted by the constraint generation block to retrieve timing parameters associated with the input interface, determine an amount of time relative to a logic transition of a clock signal that a data signal first becomes available for capture, determine an amount of time relative to the logic transition of the clock signal that the data signal remains valid, generate timing constraints relative to the input interface in response to the determinations and timing parameters, and graphically illustrate the generated timing constraints.

In this embodiment, retrieving timing parameters associated with the input interface can comprise retrieving timing parameters from a graphical user interface projected by the development station. The timing parameters can comprise: a description of an input interface type; a data rate type associated with the data signal; and a description of a transition type of the clock signal that is used by the input interface to capture the data signal. Determining an amount of time relative to a transition of a clock signal that a data signal first becomes available for capture can comprise determining an ideal rising offset value in response to the retrieved timing parameters. Determining an amount of time relative to the transition of the clock signal that the data signal remains valid can comprise determining an ideal falling offset value in response to the retrieved timing parameters. Generating timing constraints relative to the input interface in response to the determinations and timing parameters can comprise generating timing constraint code segments in a language that is native to the development station.

Graphically illustrating the generated timing constraints can comprise: graphically displaying a clock detail selection area that provides details associated with the clock signal; and modifying the details associated with the clock signal from within the clock detail selection area. Graphically illustrating the generated timing constraints can further comprise: graphically displaying a rising and falling edge parameter area that provides details associated with the data signal relative to the clock signal; and modifying the relative details associated with the data and clock signals from within the rising and falling edge parameter area. Graphically illustrating the generated timing constraints can further comprise graphically displaying a timing diagram that reflects timing relationships between the data and clock signals as defined within the clock detail selection area and the rising and falling edge parameter area.

In accordance with another embodiment of the invention, a method of automatically generating timing constraints for an input interface comprises gathering timing information associated with the input interface, generating ideal timing constraints associated with the input interface in response to the gathered timing information, displaying a graphical representation of the ideal timing constraints within a timing diagram, displaying the ideal timing constraints within a data field associated with the ideal timing constraints, updating the timing diagram to reflect modifications made to the ideal timing constraints within the data field, and updating the data field to reflect modifications made to the timing diagram.

BRIEF DESCRIPTION OF THE DRAWINGS

Various aspects and advantages of the invention will become apparent upon review of the following detailed description and upon reference to the drawings in which.

DETAILED DESCRIPTION

A portion of the disclosure of this patent document contains material which is subject to copyright protection. The copyright owner has no objection to the reproduction of the patent document or the patent disclosure, as it appears in the Patent and Trademark Office patent file or records, but otherwise reserves all copyrights and associated copyright ownership privileges.

Generally, various embodiments of the present invention are applied to the field of integrated circuits (ICs) of which programmable logic devices (PLDs) are a subset. In particular, a method and apparatus is provided for the automatic creation of timing constraints that are based upon a graphical representation of the input interface timing parameters of one or more input interfaces of the PLD. In addition, ideal timing constraints are created for the one or more PLD input interfaces, thereby enabling the analysis of the PLD input interface(s) without requiring explicit constraints to be defined by the designer of the PLD.

Various embodiments of the present invention allow the PLD designer to broadly define the input interface timing specification for each I/O interface implemented within the PLD. In particular, the PLD designer is provided the opportunity to graphically define input interface timing parameters such as: the input interface type, e.g., system synchronous or source synchronous; the data rate type, e.g., single data rate (SDR) or double data rate (DDR); and the type of sampling clock alignment that is being utilized by the input interface, e.g., center aligned or edge aligned.

Once the input interface timing specifications are broadly defined, various embodiments of the present invention allow specific details of the input interface to be graphically displayed and modified as well. In particular, details of the input interface timing specification are graphically displayed to the designer in a manner that allows the designer to verify and/or modify the constraints from their automatically generated ideal values to other values that may be needed to meet certain specialized design requirements of the PLD.

Timing constraints may, therefore, be automatically generated by the designer without the need for the designer to possess any detailed knowledge of the associated constraint language parameters. The automated process removes any potential for improperly defining the input constraint language parameters associated with the input interface(s). In addition, the designer's productivity is enhanced by removing the uncertainty and error potential that is inherent with conventional constraint definition processes.

Figure 1:
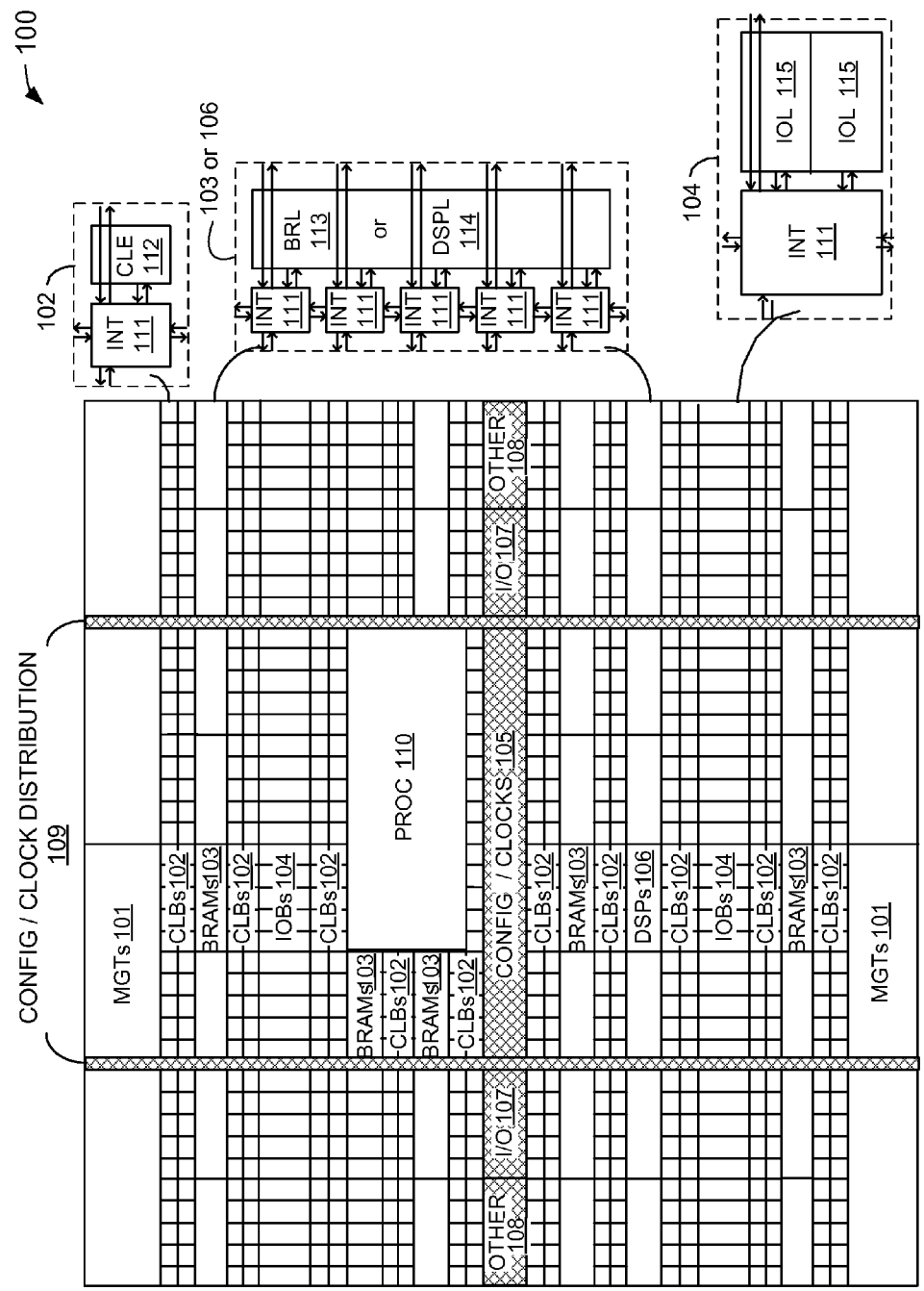
FIG. 1 illustrates an exemplary Field Programmable Gate Array (FPGA) architecture.

Turning to FIG. 1, a PLD, such as FPGA 100, is illustrated that exemplifies a PLD that may include a plurality of I/O interfaces, such as multigigabit transceivers (MGTs) 101, specialized input/output blocks (I/O) 107 (e.g., configuration ports and clock ports), and input/output blocks (IOBs) 104, having timing constraints that may be automatically generated in accordance with the various embodiments of the present invention. FPGA 100 also includes a large number of other programmable tiles that include configurable logic blocks (CLBs) 102, random access memory blocks (BRAMs) 103, configuration and clocking logic (CONFIG/CLOCKS) 105, digital signal processing blocks (DSPs) 106, and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An 10B 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, an area near the center of the die (shown shaded in FIG. 1) is used for configuration, clock, and other control logic. Vertical areas 109 extending from this area are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs are typically included wherever the CLBs appear, to facilitate the efficient implementation of user logic, but the number of adjacent CLB columns varies with the overall size of the FPGA.

Figure 2:
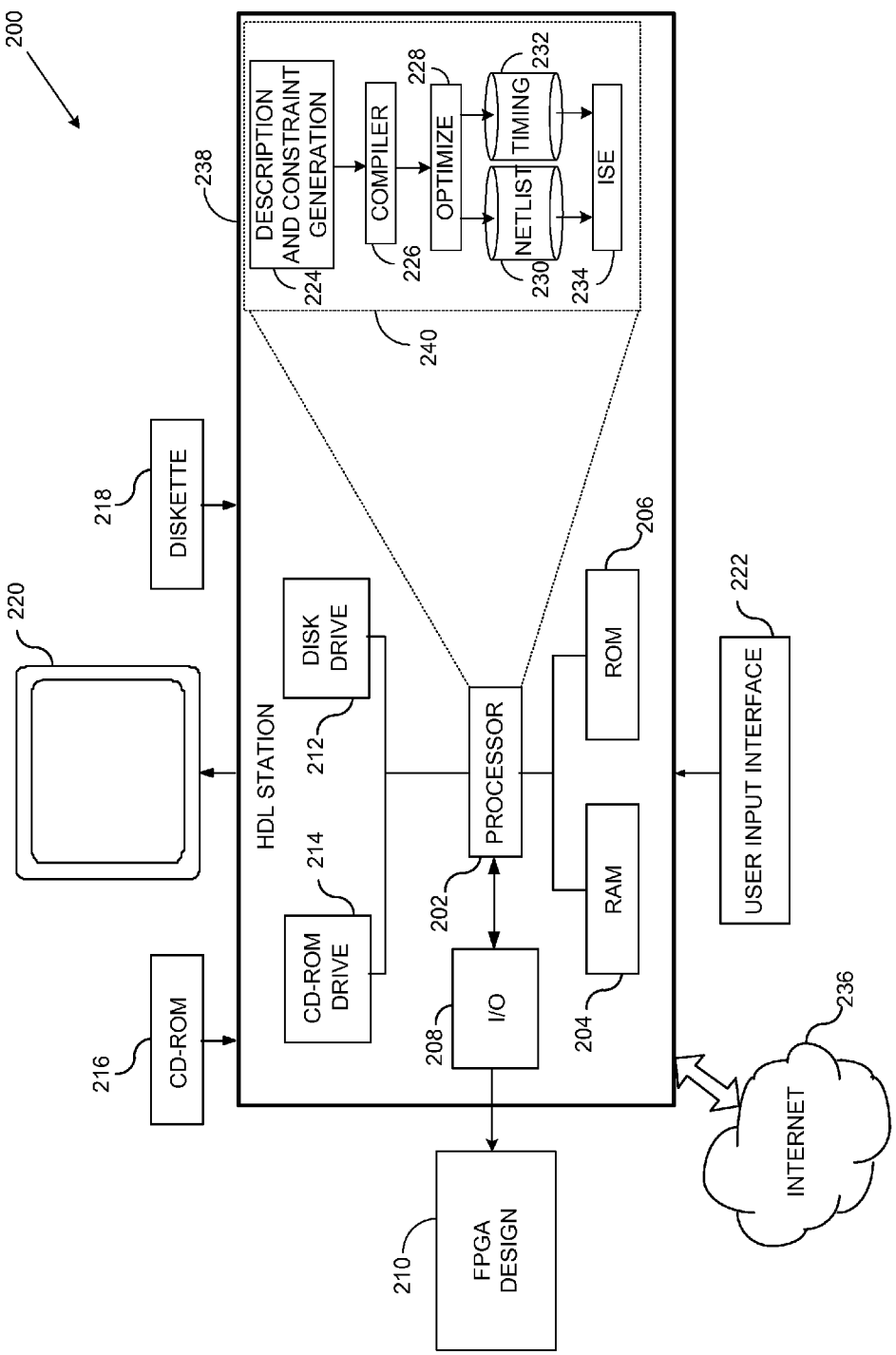
FIG. 2 illustrates a development/analysis station that may be utilized to automate the application of timing constraints to the input interfaces of the FPGA of FIG. 1.

The automatic generation of timing constraints for the various input interfaces of a PLD, as well as all of the other definitions required to define an operation of FPGA 100 of FIG. 1, may be realized by the designer at an HDL analysis station as exemplified in FIG. 2. Verilog and VHDL represent two of the more popular HDL languages in use today, which may be used to define and analyze the structure of a PLD based design. In particular, HDL facilitates a description of the manner in which a design is decomposed into logic regions and further allows a description of the manner in which each logic region of the design is to be interconnected and subsequently analyzed.

The exemplary computing arrangement that is suitable for performing HDL definition and analysis activities in accordance with the various embodiments of the present invention includes HDL station 238, which includes a central processor (CPU) 202 coupled to random access memory (RAM) 204 and read-only memory (ROM) 206. The ROM 206 may also be other types of storage media to store programs, such as programmable ROM (PROM), electronically erasable PROM (EEPROM), etc. The processor 202 may communicate with other internal and external components through input/output (I/O) circuitry 208 to provide, for example, a configuration bit stream to define the one or more FPGAs that may exist within FPGA 210.

HDL station 238 may include one or more data storage devices, including hard and floppy disk drives 212, CD-ROM drives 214, and other hardware capable of reading and/or storing information such as, e.g., a DVD. Software for facilitating the FPGA design definition activities in accordance with an embodiment of the present invention may be stored and distributed on a CD-ROM 216, diskette 218 or other form of media capable of portably storing information. These storage media may be inserted into, and read by, devices such as, e.g., the CD-ROM drive 214, and the disk drive 212.

The software for facilitating automated timing constraint generation may also be transmitted to HDL station 238 via data signals, such as being downloaded electronically via a network, such as Internet 236. HDL station 238 is coupled to a display 220, which may be any type of known display or presentation screen, such as, e.g., LCD displays, plasma displays, and cathode ray tubes (CRT). A user input interface 222 is provided, including one or more user interface mechanisms such as, e.g., a mouse, keyboard, microphone, touch pad, touch screen, and voice-recognition system.

Processor 202 may be used to execute FPGA physical design/analysis tools 240 to aid in the minimization and optimization of the equations extracted from the HDL files. For example, description/constraint files (not shown) may provide, among other definitions, timing constraints that are automatically generated by description and constraint generation block 224 in response to a description of the input interface timing parameters as defined by the designer. As discussed in more detail below, a graphical user interface may be projected by HDL station 238, so as to allow the PLD designer an opportunity to broadly define input interface timing parameters such as: the input interface type, e.g., system synchronous or source synchronous; the data rate type, e.g., single data rate (SDR) or double data rate (DDR); and the type of sampling clock alignment that is being used, e.g., center aligned or edge aligned.

Once the input interface timing parameters are broadly defined, HDL station 238 further allows specific details of the input interface timing parameters to be graphically displayed and modified as well. In particular, details of the input interface timing parameters are graphically displayed to the designer in a manner that allows the designer to verify and/or modify the parameters from their automatically generated ideal values to other values that may be needed to meet certain specialized design requirements of the PLD.

Description and constraint generation block 224 receives the completely defined input interface timing parameters and then automatically generates the ideal timing constraints without the need for the designer to possess any detailed knowledge of the associated constraint language parameters. The automated process removes any potential for improperly defining the input constraint language parameters associated with the input interface(s). In addition, the designer's productivity is enhanced by removing the uncertainty and error potential that is inherent with conventional constraint definition processes.

Compiler 226 then parses through the resulting HDL behavioral source code and description/constraint files to extract known functions, e.g., arithmetic functions, multiplexers, memories, etc., that correspond to the various logic blocks and I/O interface definitions of the user design, which are then optimized by optimize block 228. Net list 230, timing 232, and integrated software environment (ISE) block 234 each interoperate to formulate FPGA design 210 that is substantially dependent upon the intended FPGA's architecture and context, while optimizing the placement of the compiled logic blocks within FPGA design 210. The context, for example, may influence inter-function optimizations such as replication, merging, re-timing, and pipelining that may be defined by the timing requirements and topology of the design.

Figure 3:
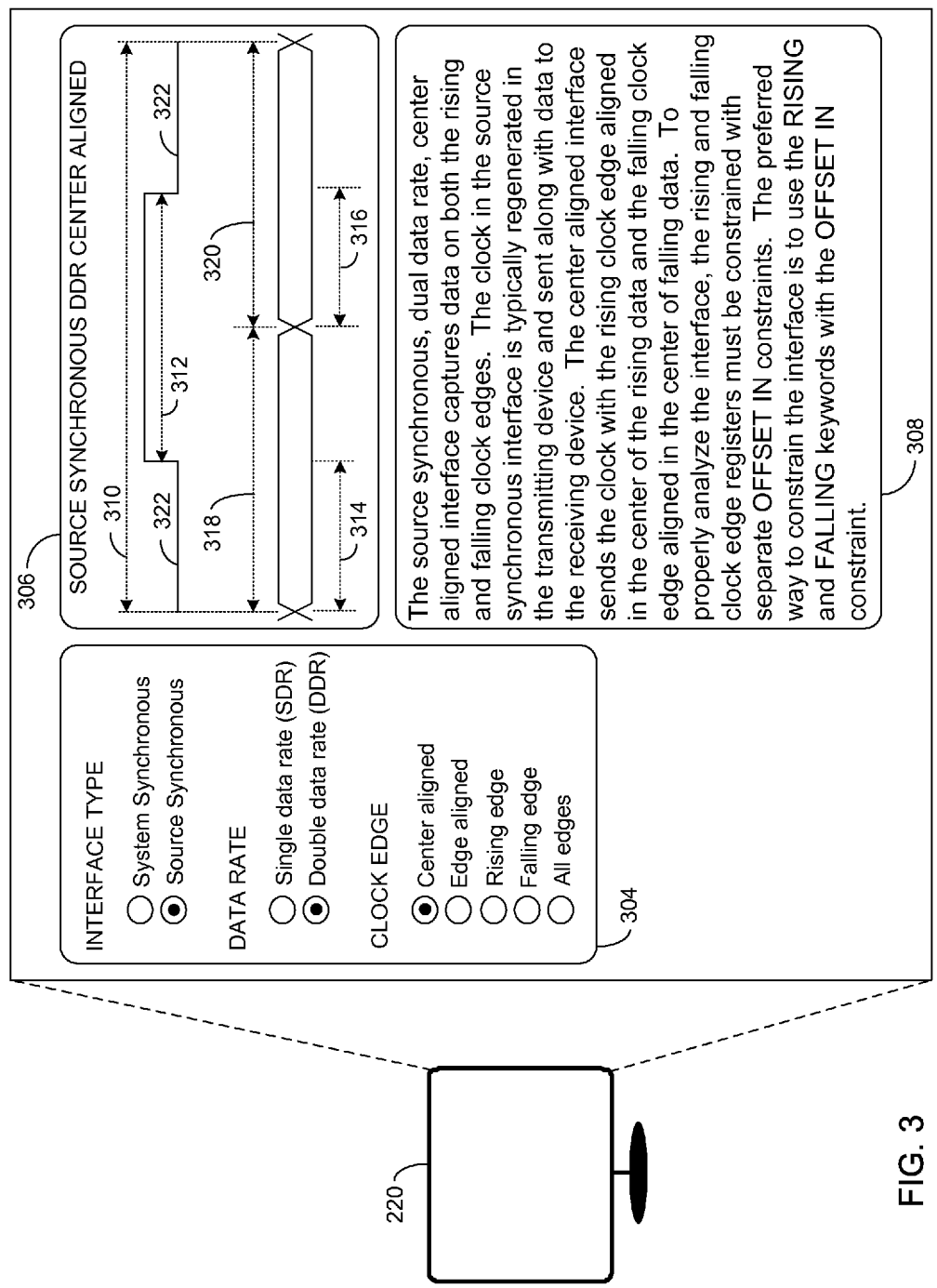
FIG. 3 illustrates a graphical user interface allowing the FPGA designer to specify input interface timing parameters in accordance with one embodiment of the present invention.

Turning to FIG. 3, a graphical user interface is provided to, e.g., display 220 of FIG. 2, that allows the PLD designer to define input interface timing parameters 304 for each I/O interface of FPGA design 210 in accordance with one embodiment of the present invention. An interface timing diagram 306 is also provided by the graphical user interface, whereby input interface timing parameters 304 are converted into graphical information. As such, the PLD designer is provided with graphical feedback that reflects the data and clock relationships as they relate to the input interface timing parameters 304 as selected by the PLD designer. An input interface assistant area 308 is also provided to allow the PLD designer to read a description of the input interface as defined by input interface timing parameters 304.

In order for FPGA physical design/analysis tools 240 to utilize input interface timing parameters 304, however, input interface timing parameters 304 must first be expressed in terms of the input constraints language. In particular, the input constraints language must define: 1) the scope of the constraint application, i.e., the input interface(s) that are affected by the constraints; 2) the amount of time relative to the capturing clock edge that the data first becomes available; and 3) the amount of time that the data remains valid. As can be seen from the graphical user interface of FIG. 3, however, input interface timing parameters 304 only provide a high level description of the input interface. As such, more detailed information, such as the information that is itemized in Table 1, is required before the input interface constraints may be fully defined.

TABLE 1

| Parameter | Timing Diagram Location | Description |
|---|---|---|
| PERIOD | 310 | Period of the capturing clock signal waveform |
| HIGH | 312 | Duration of a logic high in one period of the capturing clock signal waveform |
| LOW | 322 | Duration of a logic low in one period of the capturing clock signal waveform |
| ROI | 314 | Rising OFFSET IN = time before/after rising capturing clock edge that data first becomes valid |
| RVAL | 318 | Rising edge data valid window (data eye width) |
| FOI | 316 | Falling OFFSET IN = time before/after falling capturing clock edge that data first becomes valid |
| FVAL | 320 | Falling edge data valid window (data eye width) |

For example, parameters PERIOD 310, HIGH 312, and LOW 322 are required before the clock frequency and duty cycle may be determined. In addition, setup time parameters, ROI 314 and FOI 316, as well as valid data eye widths, RVAL 318 and FVAL 320, are required before set-up time and hold-time constraints may be imposed upon the input interface. In one embodiment, therefore, ideal values for the parameters of Table 1 may be automatically and optimally generated in response to the definitions provided by the graphical user interface of FIG. 3. In alternate embodiments, the PLD designer may be given the opportunity to modify the ideal values of the input interface timing parameters as may be required by the particular application.

Figure 4:
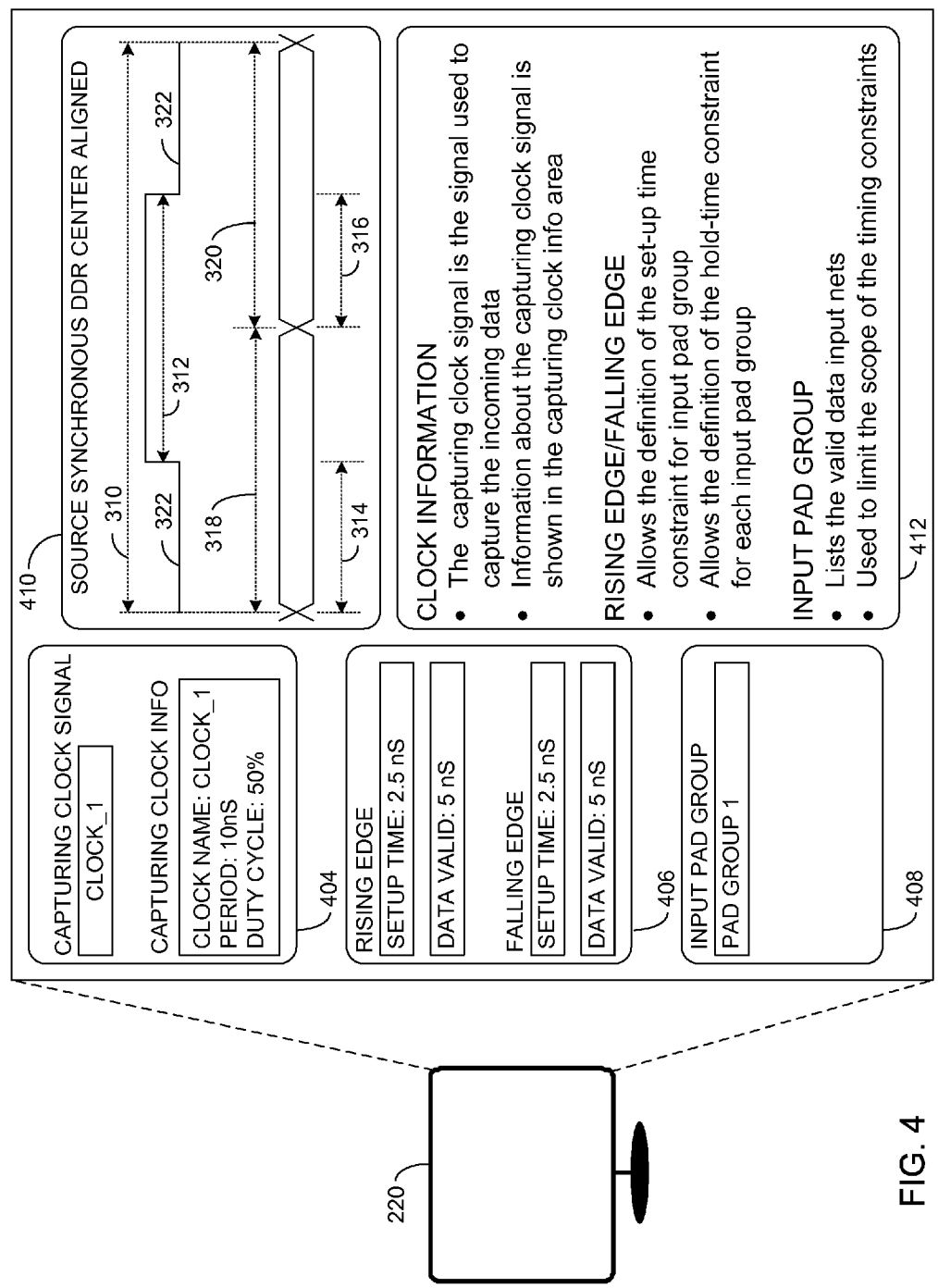
FIG. 4 illustrates a graphical user interface allowing the FPGA designer to specify more detailed input interface timing parameters in accordance with one embodiment of the present invention.

Turning to FIG. 4, a graphical user interface is provided to, e.g., display 220 of FIG. 2, that allows the PLD designer to verify/modify more detailed input interface timing parameters for each I/O interface of FPGA design 210. In particular, clock detail selection area 404 allows the definition/modification of the capturing clock signal that is to be used to capture the incoming data signal, as well as the associated capturing clock signal parameters, e.g., clock period and duty cycle. The rising edge and falling edge parameters 406 may also be verified/modified, which allows the designer to constrain the setup and hold times for each input pad group that is specified in area 408, where an input pad group identifies a group of signal pads on the PLD that receive the input data signals of interest. In such an instance, the constraints specified in areas 404-406 may be individually applied to only input signal pads that are defined in input pad group 408. As discussed above in relation to FIG. 3, interface assistant text portion 412 provides a textual description of the input interface as specified in clock detail selection area 404 and rising edge and falling edge parameter area 406.

It is noted that all details that are verified/modified within data input sections 404-408 are graphically illustrated in the interface timing diagram area 410. In such an instance, the PLD designer is given the opportunity to visually confirm that the input interface timing parameters of data input sections 404-408 match those that are intended to be exhibited by the corresponding input interface.

In alternate embodiments, the PLD designer is given the opportunity to "point, click, and drag" portions of the interface timing diagram area 410 to correspondingly modify the parameters listed in data input sections 404-408. For example, by sliding the rising/falling edge of the capturing clock signal left or right using a mouse or similar pointing device of HDL station 238, parameters PERIOD, HIGH, LOW, ROI, and FOI of Table 1 are correspondingly affected, where the change in values of the affected parameters is reflected in data input sections 404-408. As such, any modifications made within interface timing diagram area 410 are reflected by the corresponding changes in the values of the affected parameters listed in data input sections 404-408.

It is understood that while the graphical user interfaces that are depicted in FIGS. 3 and 4 represent an input interface timing diagram that relates to a source synchronous, DDR, center aligned transceiver system, other configurations may also be defined. Some of the most common interface variations that may be defined by the graphical user interfaces of HDL station 238 include, for example: a source synchronous, DDR, edge-aligned configuration; a source synchronous, SDR, edge-aligned configuration; a source synchronous, SDR, center-aligned configuration; a system synchronous, SDR, rising-edge aligned configuration; and a system synchronous, SDR, falling-edge aligned configuration.

Figure 5:
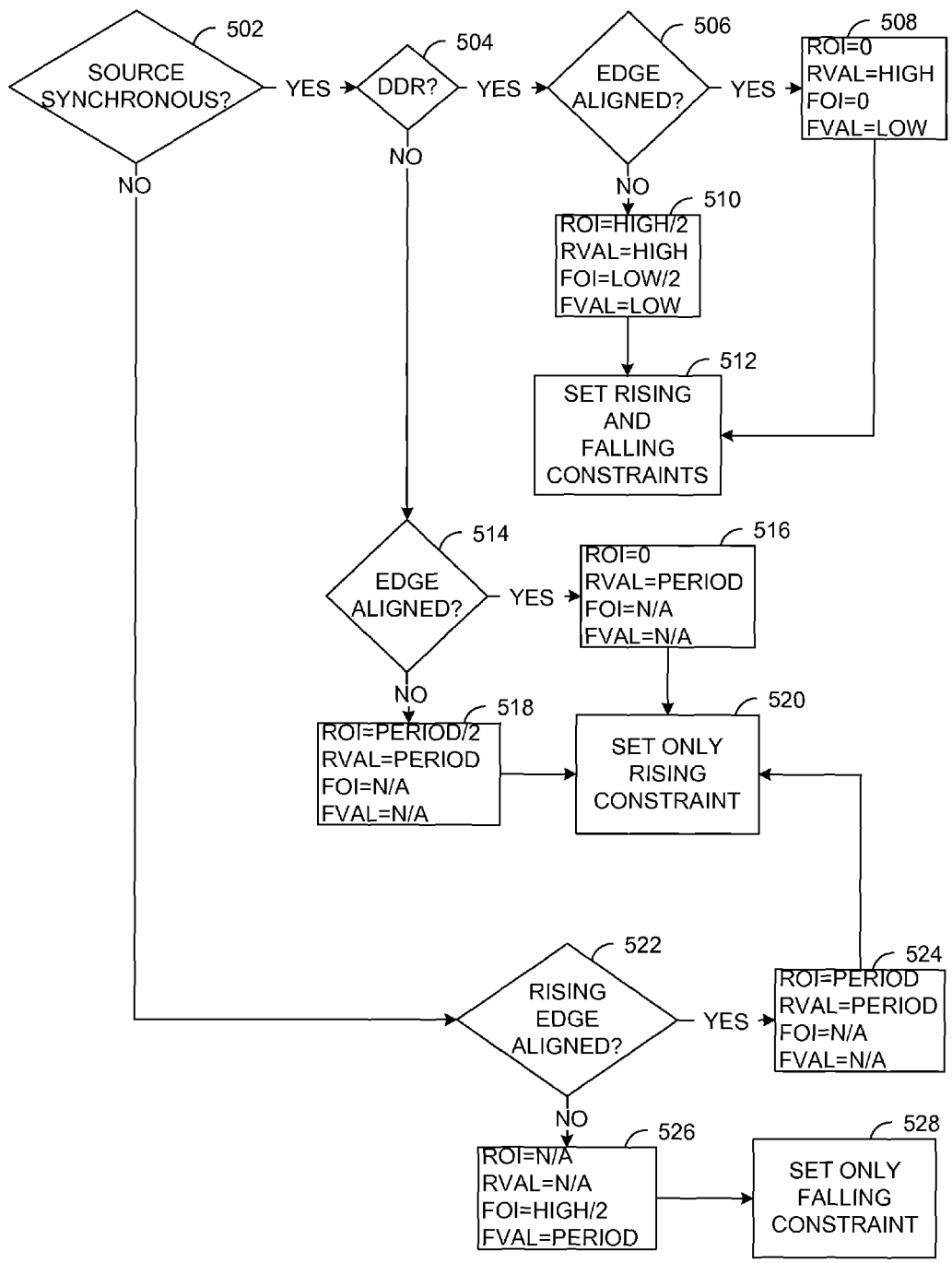
FIG. 5 illustrates a flow diagram of an automated method to generate optimal timing constraints in accordance with one embodiment of the present invention.

Turning to FIG. 5, a flow diagram of an automated constraint parameter generation method is illustrated in accordance with one embodiment of the present invention, whereby timing constraints are automatically generated based upon input interface timing parameters provided for each respective input interface of interest. As discussed above in relation to FIG. 2, processor 202, in combination with description and constraint generation block 224, executes the flow diagram of FIG. 5 to provide automated constraint generation activities as provided herein.

It is noted that the optimal constraint generation method that is depicted in FIG. 5 generates ideal constraints for a given input interface variation as defined by the graphical user interface of FIG. 3. Since the PLD designer is knowledgeable of input interface timing parameters 304 that are required to configure a particular input interface and since the optimal constraint generation method depicted in FIG. 5 converts input interface timing parameters 304 to their corresponding timing constraints, the PLD designer need not be knowledgeable of the actual constraint language being utilized.

Instead, description and constraint generation block 224 generates constraints that are compatible with the constraint language being utilized by HDL station 238. Furthermore, processor 202, in combination with description and constraint generation block 224, automatically generates ideal constraints that relate to input interface timing parameters 304, which are then displayed by the graphical user interface depicted in FIG. 4. The PLD designer is then free to verify/modify the ideal constraints, as discussed above in relation to FIG. 4, as may be required by a particular application.

The optimal constraint generation method of FIG. 5 first requires information concerning the capturing clock signal, such as the value of the duty cycle of the capturing clock signal, as well as the values of parameters PERIOD, HIGH, and LOW as itemized in Table 1. The value of parameter, PERIOD, may be defined by the PLD designer in clock detail selection area 404 of FIG. 4, or conversely, may be defined by a default period value. Similarly, the value of the duty cycle of the capturing clock signal may be defined by the PLD designer in clock detail selection area 404 of FIG. 4, or conversely, may be defined by a default duty cycle value. The values of parameters HIGH and LOW may then be calculated as:

$$HIGH = PERIOD * \text{duty cycle} \qquad (1)$$

$$LOW = PERIOD - HIGH. \qquad (2)$$

Should steps 502 and 504 be answered in the affirmative and step 506 answered in the negative, then a source synchronous, DDR, center aligned input interface configuration is desired by the PLD designer, which corresponds to the input interface timing parameters as depicted in FIGS. 3 and 4. As such, the remaining values of the parameters of Table 1 may then be populated with the values illustrated in step 510.

For example, since the data rate type is programmed to be, e.g., DDR, and the clock edge type is programmed to be, e.g., center aligned, then each transition of the capturing clock signal is aligned at the center of the data valid period where each transition of the capturing clock signal latches the corresponding data bit. In addition, the period of the capturing clock signal utilized by a DDR input interface is generally equal to twice the period of the data signal being captured. Since the capturing clock signal exhibits a 50% duty cycle, then the amount of time that the data bit becomes valid before the rising clock edge occurs, i.e., ROI, is equal to one half the value of HIGH. Similarly, the amount of time that the data bit remains valid after the falling clock edge occurs, i.e., FOI, is also equal to one half the value of HIGH. It also follows that the data valid window, i.e., RVAL/FVAL, for each of the rising/falling clock edges, respectively, is equal to HIGH/LOW, respectively.

It can be seen by inspection that interface timing diagram 306 accurately displays the populated values of the parameters of Table 1 for a source synchronous, DDR, center aligned input interface configuration, as defined by input interface timing parameters 304 of FIG. 3 and clock detail selection area 404 of FIG. 4, for a capturing clock signal that exhibits, e.g., a 10 ns period with a 50% duty cycle. That is to say, in other words, that the rising edge setup time is calculated to be: ROI=HIGH/2=2.5 ns and the falling edge setup time is calculated to be: FOI=LOW/2=2.5 ns. Similarly, the rising edge data valid time is calculated to be: RVAL=HIGH=5 ns and the falling edge data valid time is calculated to be: FVAL=LOW=5 ns.

Figure 6:
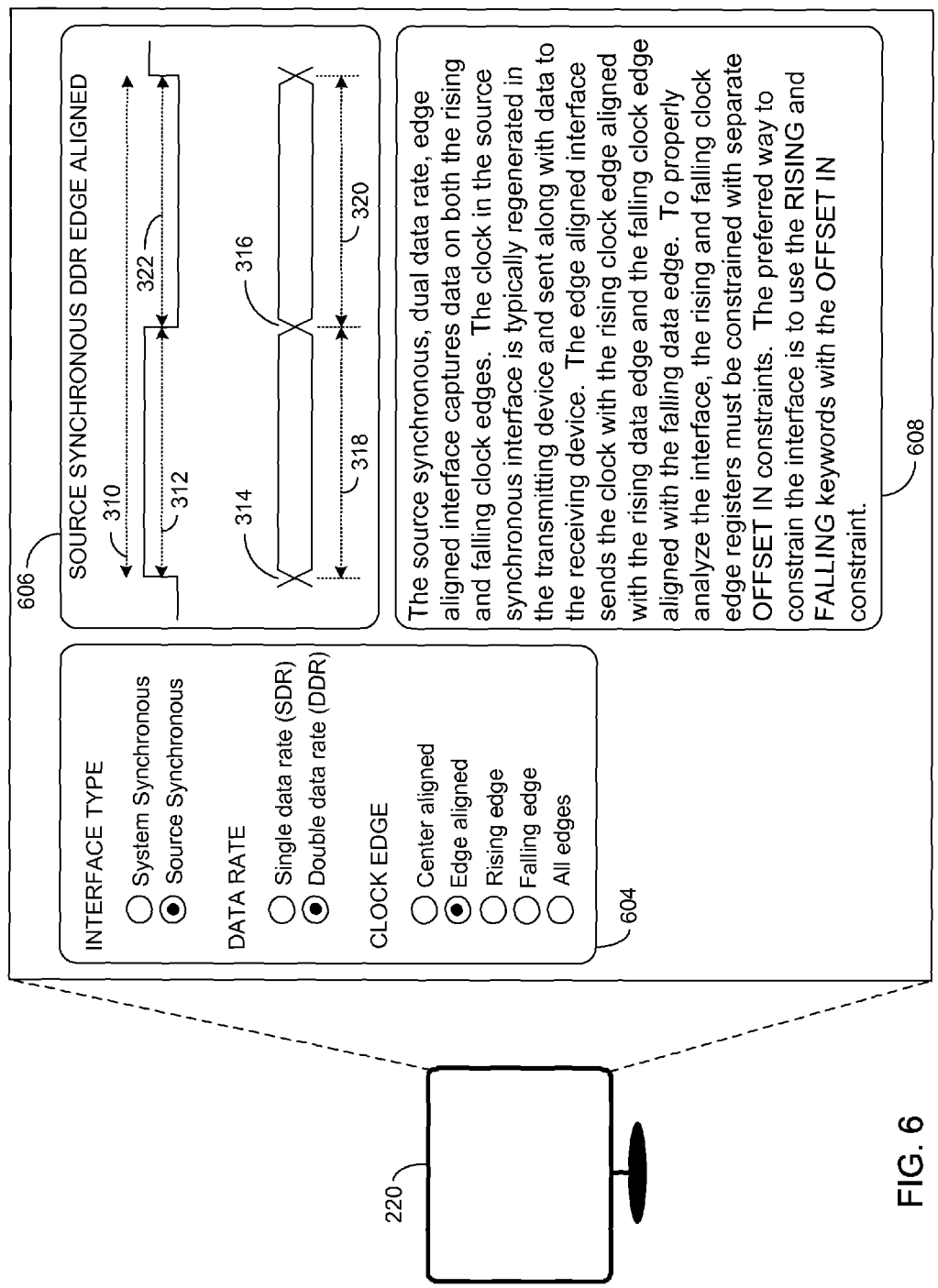
FIG. 6 illustrates a graphical user interface allowing the FPGA designer to specify input interface timing parameters in accordance with an alternate embodiment of the present invention.

Should step 506 instead be answered in the affirmative, then a source synchronous, DDR, edge aligned input interface configuration is desired by the PLD designer, which corresponds to the input interface timing parameters as depicted in FIG. 6. As such, the remaining values of the parameters of Table 1 may then be populated with the values illustrated in step 508. It can be seen by inspection that interface timing diagram 606 accurately displays the populated values of the parameters of Table 1 for a source synchronous, DDR, edge aligned input interface configuration as defined by input interface timing parameters 604 of FIG. 6.

As verified in step 512 and as further explained in interface assistant areas 308 and 608 of FIGS. 3 and 6, respectively, the preferred method to constrain the input interface is to use the "RISING" and "FALLING" keywords with the OFFSET IN constraint as illustrated in the following automatically generated code sequence:
Rising Constraint: OFFSET=IN (ROI) ns VALID (RVAL) ns BEFORE "Clock" RISING;
Falling Constraint: OFFSET=IN (FOI) ns VALID (FVAL) ns BEFORE "Clock" FALLING;
where the values of the parameters in parenthesis are taken directly from the corresponding detailed constraint values as depicted, for example, in clock detail selection area 404 and the corresponding rising edge and falling edge parameters 406 (i.e., the OFFSET IN parameters) of FIG. 4. It should be noted that the OFFSET IN parameter values as depicted in FIG. 4 are different for the source synchronous, DDR, edge aligned input interface configuration as depicted in FIG. 6.

Should step 504 instead be answered in the negative and step 514 be answered in the affirmative, then a source synchronous, SDR, edge aligned input interface configuration is desired by the PLD designer. As such, the remaining values of the parameters of Table 1 may then be populated with the values illustrated in step 516. Should step 514 instead be answered in the negative, then a source synchronous, SDR, center aligned input interface configuration is desired by the PLD designer and the remaining values of the parameters of Table 1 may instead be populated with the values illustrated in step 518. As verified in step 520, the preferred method to constrain the input interface is to use only the "RISING" keywords with the OFFSET IN constraint as illustrated in the following code sequence:
Rising Constraint: OFFSET=IN (ROI) ns VALID (RVAL) ns BEFORE "Clock" RISING;
where the values of the parameters in parenthesis are taken directly from the corresponding detailed constraint values in the corresponding clock detail selection and OFFSET IN parameter areas (not shown).

Should step 502 instead be answered in the negative and step 522 be answered in the affirmative, then a system synchronous, rising-edge aligned input interface configuration is desired by the PLD designer. As such, the remaining values of the parameters of Table 1 may then be populated with the values illustrated in step 524. As verified in step 520, the preferred method to constrain the input interface is to use only the "RISING" keywords with the OFFSET IN constraint as illustrated in the following code sequence:
Rising Constraint: OFFSET=IN (ROI) ns VALID (RVAL) ns BEFORE "Clock" RISING;
where the values of the parameters in parenthesis are taken directly from the corresponding detailed constraint values in the corresponding clock detail selection and OFFSET IN parameter areas (not shown).

Should step 502 be answered in the negative and step 522 be answered in the negative, then a system synchronous, falling-edge aligned input interface configuration is desired by the PLD designer. As such, the remaining values of the parameters of Table 1 may then be populated with the values illustrated in step 526. As verified in step 528, the preferred method to constrain the input interface is to use only the "FALLING" keywords with the OFFSET IN constraint as illustrated in the following code sequence:
Falling Constraint: OFFSET=IN (FOI) ns VALID (FVAL) ns BEFORE "Clock" FALLING;
where the values of the parameters in parenthesis are taken directly from the corresponding detailed constraint values in the corresponding clock detail selection and OFFSET IN parameter areas (not shown).

It is understood that the constraint code segments listed above may instead be generated in any other constraint language that may be native to, i.e., resident within, HDL station 238. As such, the PLD designer need not be knowledgeable of the particular constraint language details of HDL station 238 in order to adequately constrain the timing of an input interface. Instead, the PLD designer need only supply readily available input timing information as exemplified in FIGS. 3, 4, and 6 to adequately constrain the timing of an input interface.

Once the optimal timing constraints are calculated by the flow diagram of FIG. 5, the corresponding timing diagram and detail information is then graphically displayed as exemplified in FIG. 4. In particular, all details contained within data input sections 404-408 are graphically illustrated in the interface timing diagram area 410. In such an instance, the PLD designer is given the opportunity to visually confirm that the input interface timing parameters of data input sections 404-408 match those that are intended to be exhibited by the corresponding input interface. The PLD designer may then make modifications to the optimal timing constraints as required by modifying the data values contained within data input sections 404-408 accordingly.

The PLD designer is alternately given the opportunity to "point, click, and drag" portions of the interface timing diagram area 410 to correspondingly modify the parameters listed in data input sections 404-408. For example, by sliding the rising/falling edge of the capturing clock signal left or right using a mouse or similar pointing device, parameters PERIOD, HIGH, LOW, ROI, and FOI of Table 1 are correspondingly affected, where the change in values of the affected parameters is reflected in data input sections 404-408. As such, any modifications made within interface timing diagram area 410 are reflected by the corresponding changes in the values of the affected parameters listed in data input sections 404-408. Once the timing parameters of a particular input interface are adequately configured, verified, and/or modified, analysis of the performance of the input interface may commence through use of the simulation capabilities of HDL station 238.

Other aspects and embodiments of the present invention will be apparent to those skilled in the art from consideration of the specification and practice of the invention disclosed herein. For example, verification and modification of a variety of input interface timing parameters may be employed to automatically determine the input timing constraints of a variety of input interfaces as may be required by any number of applications and not necessarily only those as disclosed herein. Thus, it is intended that the specification and illustrated embodiments be considered as examples only, with a true scope and spirit of the invention being indicated by the following claims.

What is claimed is:

1. A method of automatically generating timing constraints for an input interface, comprising:
retrieving user-specified timing parameters associated with the input interface;
wherein the timing parameters specify an interface type that is one of system synchronous or source synchronous, a rate type that is one of single data rate or double data rate, and a transition type that specifies an alignment of a transition of a clock signal relative to a data valid period;
determining a first amount of time relative to a transition of the clock signal that a data signal first becomes available for capture in response to the user-specified interface type, rate type, and transition type;

determining a second amount of time relative to the transition of the clock signal that the data signal remains valid in response to the user-specified interface type, rate type, and transition type;

generating, by a processor, timing constraint code segments that specify timing constraints relative to the input interface in response to the determined first and second amounts of time and timing parameters; and graphically illustrating the generated timing constraints.

2. The method of claim 1, wherein retrieving timing parameters associated with the input interface comprises retrieving timing parameters from a graphical user interface.

3. The method of claim 1, wherein the determining of the first amount of time relative to a transition of a clock signal that a data signal first becomes available for capture comprises determining an ideal rising offset value in response to the retrieved timing parameters.

4. The method of claim 3, wherein the determining of the second amount of time relative to the transition of the clock signal that the data signal remains valid comprises determining an ideal falling offset value in response to the retrieved timing parameters.

5. The method of claim 4, wherein generating timing constraints relative to the input interface in response to the determinations and timing parameters comprises generating timing constraint code segments in a language that is native to a development station that hosts the graphical user interface.

6. The method of claim 5, wherein graphically illustrating the generated timing constraints comprises:
graphically displaying a clock detail selection area that provides details associated with the clock signal; and
modifying the details associated with the clock signal from within the clock detail selection area.

7. The method of claim 6, wherein graphically illustrating the generated timing constraints further comprises:
graphically displaying a rising and falling edge parameter area that provides details associated with the data signal relative to the clock signal; and
modifying the relative details associated with the data and clock signals from within the rising and falling edge parameter area.

8. The method of claim 7, wherein graphically illustrating the generated timing constraints further comprises graphically displaying an input pad group that provides details associated with a group of signal pads configured to receive the data signal.

9. The method of claim 8, wherein graphically illustrating the generated timing constraints further comprises graphically displaying a timing diagram that reflects timing relationships between the data and clock signals as defined within the clock detail selection area and the rising and falling edge parameter area.

10. A non-transitory computer-readable medium having instructions which when executed on a processor perform a method comprising:
retrieving user-specified timing parameters associated with an input interface;
wherein the timing parameters specify an interface type that is one of system synchronous or source synchronous, a rate type that is one of single data rate or double data rate, and a transition type that specifies an alignment of a transition of a clock signal relative to a data valid period;
determining a first amount of time relative to a transition of the clock signal that a data signal first becomes available for capture in response to the user-specified interface type, rate type, and transition type;
determining a second amount of time relative to the transition of the clock signal that the data signal remains valid in response to the user-specified interface type, rate type, and transition type;
generating timing constraint code segments that specify timing constraints relative to the input interface in response to the determinations determined first and second amounts of time and timing parameters; and
graphically illustrating the generated timing constraints.

11. The medium of claim 10, wherein retrieving timing parameters associated with the input interface comprises retrieving timing parameters from a graphical user interface projected by the development station.

12. The medium of claim 10, wherein the determining of the first amount of time relative to a transition of a clock signal that a data signal first becomes available for capture comprises determining an ideal rising offset value in response to the retrieved timing parameters.

13. The medium of claim 12, wherein the determining of the second amount of time relative to the transition of the clock signal that the data signal remains valid comprises determining an ideal falling offset value in response to the retrieved timing parameters.

14. The medium of claim 13, wherein generating timing constraints relative to the input interface in response to the determinations and timing parameters comprises generating timing constraint code segments in a language that is native to the development station.

15. The medium of claim 14, wherein graphically illustrating the generated timing constraints comprises:
graphically displaying a clock detail selection area that provides details associated with the clock signal; and
modifying the details associated with the clock signal from within the clock detail selection area.

16. The medium of claim 15, wherein graphically illustrating the generated timing constraints further comprises:
graphically displaying a rising and falling edge parameter area that provides details associated with the data signal relative to the clock signal; and
modifying the relative details associated with the data and clock signals from within the rising and falling edge parameter area.

17. The medium of claim 16, wherein graphically illustrating the generated timing constraints further comprises graphically displaying a timing diagram that reflects timing relationships between the data and clock signals as defined within the clock detail selection area and the rising and falling edge parameter area.

18. A method of automatically generating timing constraints for an input interface, comprising:
gathering user-specified timing information associated with the input interface;
wherein the timing information specifies an interface type that is one of system synchronous or source synchronous, a rate type that is one of single data rate or double data rate, and a transition type that specifies an alignment of a transition of a clock signal relative to a data valid period;
generating, by a processor, timing constraint code segments that specify ideal timing constraints associated with the input interface in response to the user-specified interface type, rate type, and transition type;
displaying a graphical representation of the ideal timing constraints within a timing diagram;
displaying the ideal timing constraints within a data field associated with the ideal timing constraints;
updating the timing diagram to reflect modifications made to the ideal timing constraints within the data field; and
updating the data field to reflect modifications made to the timing diagram.

* * * * *